(12) United States Patent
Guo et al.

(10) Patent No.: US 6,509,274 B1
(45) Date of Patent: Jan. 21, 2003

(54) METHOD FOR FORMING ALUMINUM LINES OVER ALUMINUM-FILLED VIAS IN A SEMICONDUCTOR SUBSTRATE

(75) Inventors: Ted Guo, Palo Alto, CA (US); Jing-Pei Chou, Foster City, CA (US); Liang-Yuh Chen, Foster City, CA (US); Roderick C. Mosely, Pleasanton, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/632,486

(22) Filed: Aug. 4, 2000

(51) Int. Cl.[7] ............................................. H01L 21/302
(52) U.S. Cl. ..................... 438/697; 438/702; 438/715; 438/738
(58) Field of Search .................... 438/697, 700, 438/702, 706, 714, 715, 737, 738

(56) References Cited

U.S. PATENT DOCUMENTS

| | | | |
|---|---|---|---|
| 5,723,367 A | 3/1998 | Wada et al. | 437/248 |
| 5,851,917 A | 12/1998 | Lee | 438/627 |
| 5,854,140 A * | 12/1998 | Jaso et al. | 438/740 |
| 5,913,141 A | 6/1999 | Bothra | 438/625 |
| 5,926,736 A * | 7/1999 | deSilva | 438/637 |
| 5,939,787 A | 8/1999 | Lee | 257/740 |
| 5,972,786 A | 10/1999 | Hoshino et al. | 438/627 |
| 6,110,828 A * | 8/2000 | Guo et al. | 438/688 |
| 6,139,697 A * | 10/2000 | Chen et al. | 204/192.15 |
| 6,255,226 B1 * | 7/2001 | Zheng et al. | 438/734 |

* cited by examiner

Primary Examiner—Benjamin L. Utech
Assistant Examiner—Kin-Chan Chen
(74) Attorney, Agent, or Firm—Birgit E. Morris

(57) ABSTRACT

A method for forming aluminum lines over aluminum-filled vias in a semiconductor substrate that can compensate for some misalignment between the filled vias and the lines. By alternately depositing liner-barrier layers and aluminum layers on the substrate, different etch chemistries can be used that can anisotropically etch an aluminum layer used to form the lines without etching voids in the aluminum-filled vias.

12 Claims, 3 Drawing Sheets

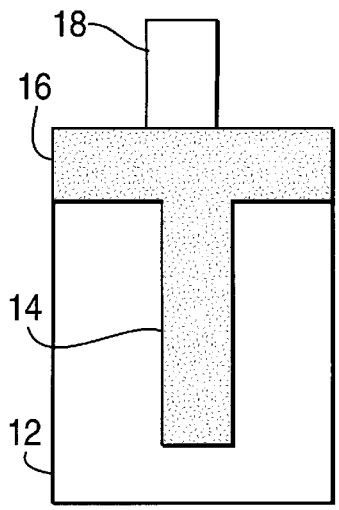
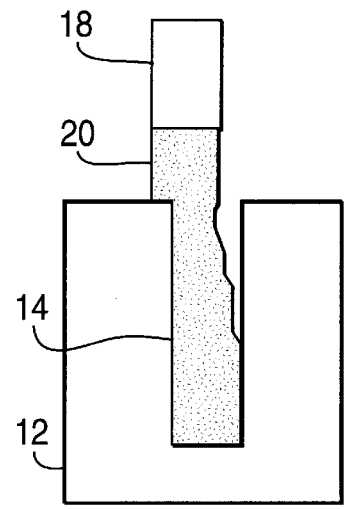
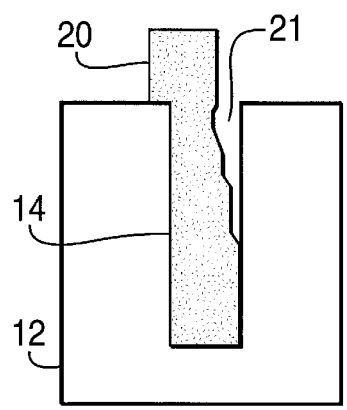
FIG. 1A
PRIOR ART
FIG. 1B
PRIOR ART
FIG. 1C
PRIOR ART
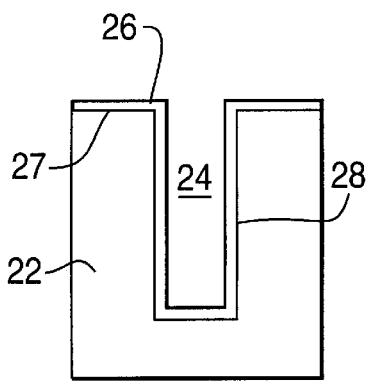
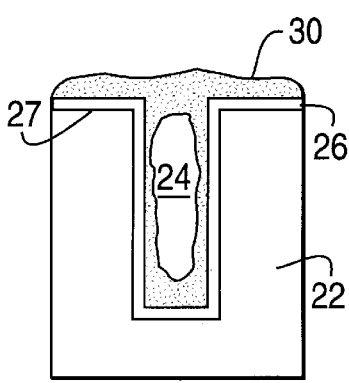
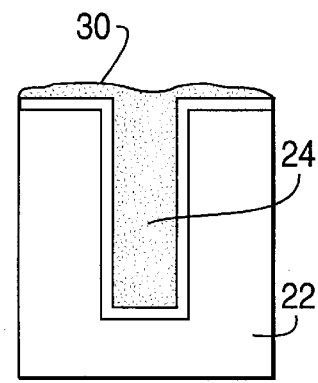
FIG. 2A
FIG. 2B
FIG. 2C

METHOD FOR FORMING ALUMINUM LINES OVER ALUMINUM-FILLED VIAS IN A SEMICONDUCTOR SUBSTRATE

This invention relates to improved methods for forming aluminum lines over aluminum-filled vias or plugs. More particularly, this invention relates to methods for forming aluminum lines over vias filled with aluminum that can compensate for some misalignment.

BACKGROUND OF THE INVENTION

Aluminum has been widely used to form conductive lines and vias in the manufacture of semiconductor devices. An opening is made in a dielectric layer, such as a silicon oxide layer, and filled with aluminum metal. An overlying aluminum line is then formed over the via to provide conductive lines to connect the via to other devices on the substrate. The use of aluminum metal is advantageous because it is highly conductive, and thus a via filled with aluminum has low resistance; it is easy to deposit, either by sputtering or by chemical vapor deposition (hereinafter CVD); and an aluminum layer can be etched readily to form conductive lines by plasma etching.

The shrinking diameter of vias and lines has also required that the via and line diameters be about the same. In the past, a line width greater than the diameter of a via (overlap) could be used, and thus accommodation to some misalignment of the patterning of the lines to the via could be readily realized. However, because circuit density has increased and feature sizes have decreased, the overlap can no longer be tolerated and reduction or elimination of line overlap (called zero overlap) has become necessary.

However, aluminum layers used to define aluminum lines have a thickness of about 5000 to 10,000 angstroms. When etching an aluminum layer to form aluminum lines, the rapid etch rate required for etching such a thick aluminum layer economically is difficult to control, particularly near the end of the etch step.

When an aluminum line is to be formed over an aluminum via, this etch rate problem is exacerbated and any exposed aluminum via due to misalignment is etched along with the line, leaving a void in the via opening. As the spacing and line width of these features is made ever smaller, i.e., for design rules of less than 0.50 micron, and particularly as design rules are reduced to 0.25 micron and less, the problem of nonalignment becomes more pronounced. A misalignment occurs because it is more difficult to precisely pattern thin, narrow aluminum lines. A result of this misalignment is that during etching to form the aluminum lines, if the line is not aligned perfectly with the aluminum via, the etchant for the aluminum layer used to form the lines etches any exposed aluminum in the via that is not covered with the line aluminum.

The problem addressed by the present invention can be illustrated with reference to FIGS. 1A to 1C.

FIG. 1A shows a silicon oxide substrate 12 having a via therein 14 filled with aluminum. An aluminum layer 16 has been deposited over the filled via 14 and a patterned photoresist layer 18 is formed thereover. It is apparent that there is some misalignment between the via 14 and the photoresist pattern 18.

The aluminum metal layer 16 is then anisotropically etched to form an aluminum line 20 beneath the photoresist line 18, as shown in FIG. 1B. Since the etch is difficult to control as the substrate 12 is approached, the etch removes not only the aluminum on the surface of the substrate 12 outside of the photoresist pattern, but also removes that portion of the aluminum via that is exposed by the misaligned line. FIG. 1C shows that after the photoresist 18 is removed, an opening or void 22 has been formed in the via 14 by the etchant.

Thus a method of etching the aluminum lines and of compensating for some misalignment between an aluminum line over an aluminum via that does not leave a void in the aluminum via would be highly desirable.

SUMMARY OF THE INVENTION

We have found a method that etches aluminum lines over aluminum vias that compensates for some misalignment in patterning the aluminum lines, but that does not leave voids in the aluminum vias. This method deposits a thin layer of aluminum by chemical vapor deposition over a barrier lined via. The thin layer of aluminum is drawn into and fills the via by heating under vacuum. Alternate aluminum and liner-barrier layers are used to form an aluminum line over the filled via, permitting the use of different etch chemistries and allowing etching of aluminum lines without etching the aluminum to form a void in the filled via.

In a first embodiment, a liner-barrier layer is deposited in the via. Aluminum is then deposited onto the surface of the substrate and into the opening, partially filling the opening. This aluminum layer is about 400 to 1000 angstroms thick. The aluminum is then heated under vacuum to draw the aluminum down into the opening, filling the opening. The aluminum film on the top surface of the substrate is then removed. A liner-barrier layer, which also acts as an etch stop, is then deposited on the substrate, an aluminum layer to make the aluminum lines is deposited, and a patterned photoresist layer is formed over the filled opening. The aluminum layer is then patterned by selectively anisotropically etching the aluminum layer. Any misalignment between the aluminum line and the aluminum via is compensated for by the barrier layer, which is removed using a different etch chemistry that does not etch the aluminum in the via.

In a second embodiment, the initial steps are the same, but the aluminum on the substrate is not removed. A liner-barrier or etch stop layer is deposited over the substrate, aluminum is deposited, and a line pattern formed beneath a patterned photoresist layer. Any misalignment is compensated for during the etch steps because the barrier layer protects the underlying aluminum. The final aluminum layer adjacent to the substrate surface is thin, and etching down to the substrate can be readily controlled by controlling the etch rate so that the etchant removes the aluminum on the surface of the substrate but does not etch the aluminum in the vias.

BRIEF DESCRIPTION OF THE DRAWING

FIGS. 1A, 1B, and 1C are cross sectional views of a filled via and an aluminum line using a conventional method. This method produces a void in the filled via.

FIGS. 2A to 2H are cross sectional views showing method steps of one embodiment of the method of the invention that forms an aluminum line over an aluminum filled via but avoids the formation of a void in the filled via.

DETAILED DESCRIPTION OF THE INVENTION

Figure 2D:
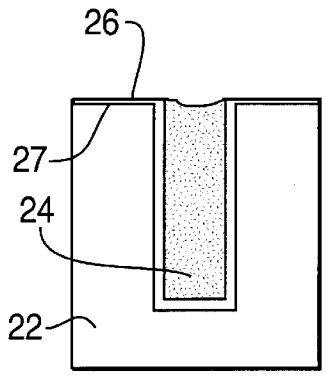

An integrated Endura® system, available from Applied Materials, Inc of Santa Clara, CA, can be fitted with various processing chambers for sequential deposition and etch steps. For example, liner/barrier layers can be deposited by sputtering in a physical vapor deposition (PVD) chamber; CVD aluminum can be deposited in a chemical vapor deposition (CVD) chamber; and one or more Centura® DPS™ RIE metal etch chambers, also trademarks of Applied Materials, Inc, can be used for the etch steps. Equipment for spinning and patterning photoresist layers are also well known.

The first embodiment of the present method will be described with respect to FIGS. 2A to 2H.

Referring to FIG. 2A, a dielectric substrate 22 has a via 24 formed therein. The dielectric substrate 22 is more commonly formed of silicon oxide, but fluorine-doped silicon oxide and other dielectric materials can also be used. A conformal barrier layer 26 is then deposited over the substrate 22 including the top surface 27 of the dielectric substrate 22 and along the walls 28 of the via 24. The barrier layer 26 can be made of one or more of tantalum, tantalum nitride, titanium or titanium nitride, as examples. This barrier layer 26 is preferably formed by a plasma sputtering method that provides a conformal layer.

A thin layer of aluminum 30 is then deposited by CVD from an aluminum compound, such as dimethyl aluminum hydrate. This aluminum layer partially fills the via 24 and then covers the top surface 27 of the dielectric substrate 22. Sufficient aluminum must be deposited to be able to fill the via 24, but this aluminum layer 30 is preferably no more than 1000 angstroms thick. FIG. 2B illustrates this step.

In order to fill in the via 24 with aluminum, the substrate 22 is heated to a temperature of about 350–500° C. under a pressure of about 0.2 to 30 millitorr, when the aluminum is softened and drawn into the via 24 to fill the via 24. This is shown in FIG. 2C. The thin aluminum layer 30 remaining over the top surface 27 of the substrate 22 is etched away using a chlorine-based etch. This etch removes the aluminum metal layer 30 and part or all of the barrier layer 26 on the top surface 27 of the substrate 22, as shown in FIG. 2D.

Figure 2E:
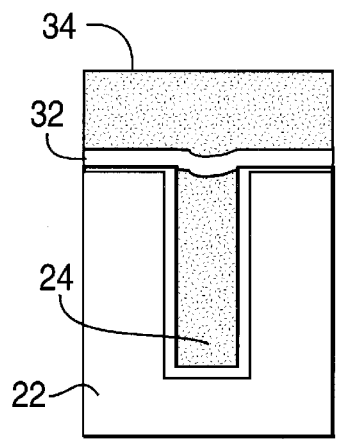
Figure 2F:
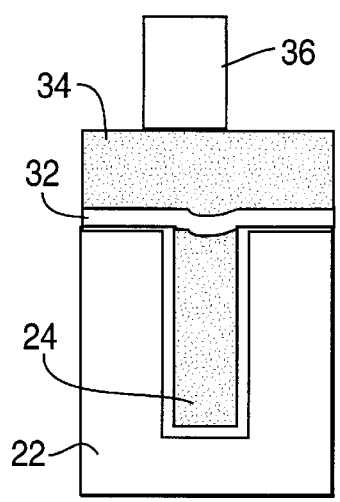
Figure 2G:
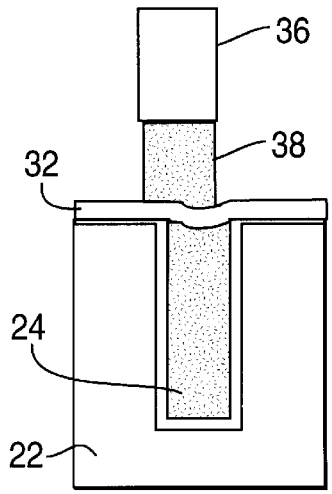
Figure 2H:
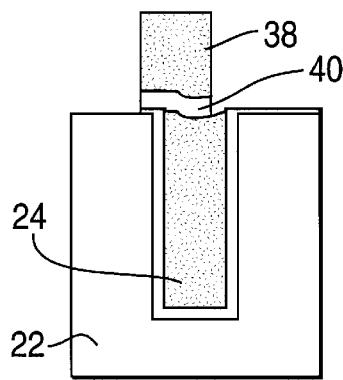

A second liner/barrier layer 32 is deposited over the substrate 22 and the filled via 24 and a second layer of aluminum 34 is deposited thereover, as shown in FIG. 2E. This second layer of aluminum 34 can be deposited either by CVD or by sputtering. A layer of photoresist is deposited and patterned to form a photoresist line 36. This is shown in FIG. 2F. In FIG. 2F the photoresist line 36 is shown somewhat misaligned with respect to the filled via 24. An aluminum line 38 is then formed by anisotropic etching using a chlorine-based chemistry. This step is shown in FIG. 2G. Lastly, the second liner/barrier layer 32 is etched using a fluorine-based chemistry to form a barrier line 40. Since aluminum metal is not rapidly etched with this chemistry, no etching of aluminum occurs and no void is formed in the filled via 24. This step is shown in FIG. 2H. Although the aluminum line 38 is somewhat misaligned with the filled via 24, the filled via 24 does not include any voids.

If desired, the substrate can be covered with a dielectric layer, such as silicon oxide (not shown)

FIGS. 3A to 3I illustrates an alternative method for forming filled vias and metal lines in accordance with the invention.

Figure 3A:
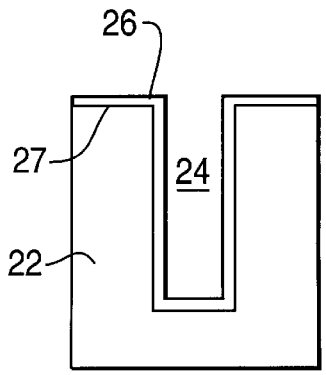
FIGS. 3A to 3I are cross sectional views showing method steps of another embodiment of the method of the invention that forms an aluminum line over an aluminum filled via but avoids the formation of a void in the filled via.
Figure 3B:
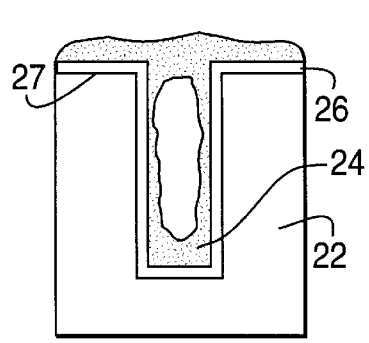
Figure 3C:
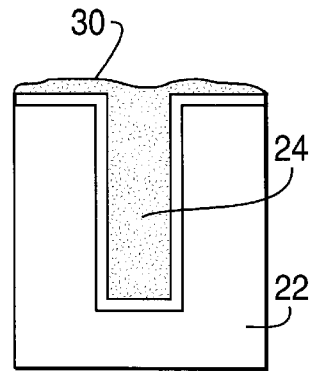
Figure 3D:
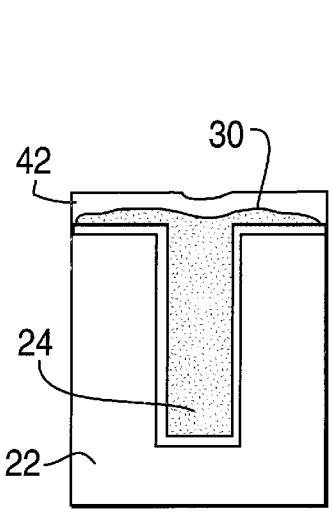
Figure 3E:
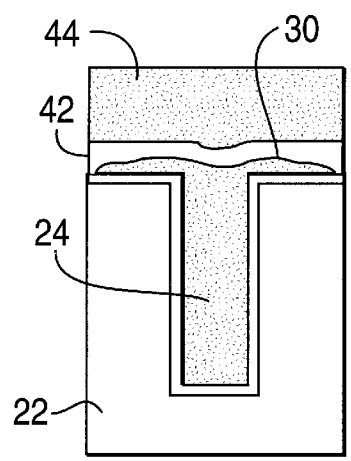
Figure 3F:
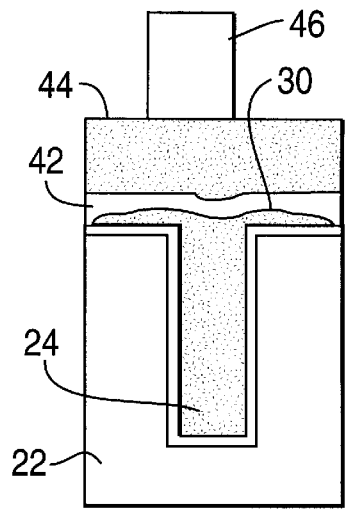
Figure 3G:
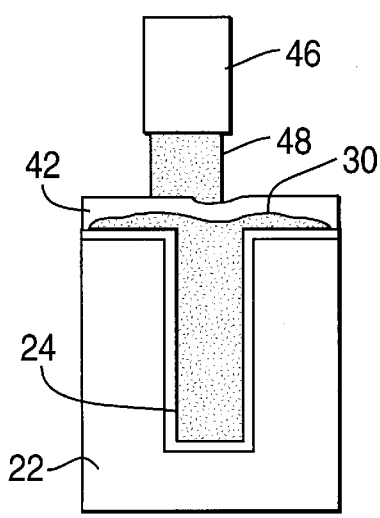
Figure 3H:
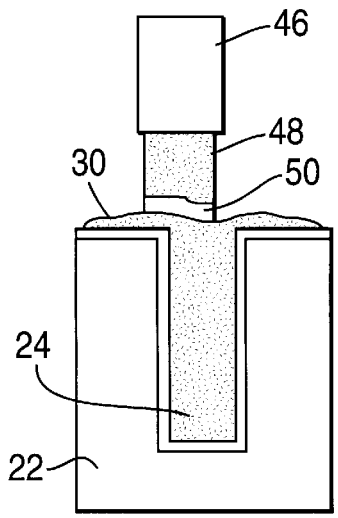

The steps shown in FIGS. 3A to 3C are the same as those of FIGS. 2A to 2C. Without removing the thin aluminum layer 30, a liner/barrier layer 42 is deposited over the filled via 24 as shown in FIG. 3D and a second layer of aluminum 44 is deposited thereover as shown in FIG. 3E. This aluminum layer 44 can be deposited by CVD or by sputtering. A photoresist layer is deposited and patterned to form a photoresist line 46, as shown in FIG. 3F. This photoresist line 46 is also somewhat misaligned with the filled via 24. The aluminum layer 44 is etched anisotropically to form an aluminum line 48 using a chlorine-based chemistry. This etch stops at the liner/barrier layer 42, as shown in FIG. 3G. The liner/barrier layer 42 is then anisotropically etched down to the aluminum layer 30, forming a line 50, as shown in FIG. 3H.

Figure 3I:
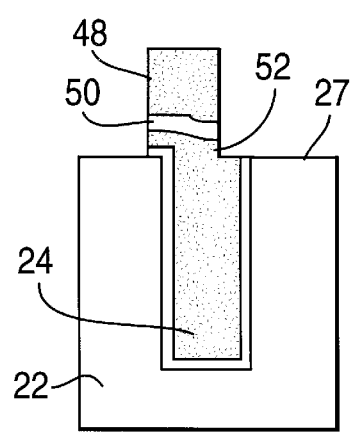

The aluminum layer 30 remaining on the top surface 27 of the substrate 22 is etched away using a carefully controlled, low etch rate method and a fluorine-based chemistry to form a thin line 52. As shown in FIG. 3I, the aluminum lines 48 and 52, although not perfectly aligned with the filled via 24, does not include a void. Lastly, the photoresist line 46 is removed.

The use of a liner barrier layer under the aluminum line permits a different etch chemistry to be used to etch the aluminum line and to etch the liner-barrier line. The latter etch can be controlled so that it does not remove aluminum from the filled via. When the aluminum remaining on the surface of the substrate is etched, since it is a very thin layer, it can be etched at a low etch rate, as by using a fluorine-based, rather than the faster etching chlorine-based etchant, to avoid etching aluminum in the filled via.

Although the invention has been described in terms of specific method steps, one skilled in the art can vary the nature of the materials and processing variables, as is known. Thus the invention is only to be limited by the scope of the appended claims.

We claim:

1. A method of forming aluminum lines over aluminum-filled vias in a dielectric substrate comprising:
   a) forming a via in the substrate;
   b) depositing a conformal liner barrier layer over the via and the surface of the substrate;
   c) depositing a layer of aluminum on the surface of the substrate that partially fills the via;
   d) heating the substrate to a temperature of about 350–500° C. under vacuum so that the aluminum layer is diffused into and fills the via;
   e) etching away the aluminum remaining on the top surface of the substrate and depositing a second liner barrier layer thereover;
   f) depositing a layer of aluminum over the filled via;
   g) forming a photoresist line over the aluminum layer;
   h) anisotropically etching the liner barrier layer without removing aluminum from the filled via;
   i) anisotropically etching the aluminum layer to form an aluminum line, and
   j) removing the photoresist.

2. A method according to claim 1 wherein a liner-barrier layer is deposited over the aluminum remaining on the top surface of the substrate after step c), the liner barrier is etched anisotropically to form a line under the aluminum line, and the remaining aluminum layer is etched without removing aluminum from the filled via.

3. A method according to claim 2 wherein the remaining aluminum layer is etched using a fluorine-based chemistry.

4. The method of claim 3 wherein the aluminum in step c) is removed by etching.

5. A method according to claim 1 wherein the aluminum layer of step c) is deposited by chemical vapor deposition from an aluminum compound.

6. A method according to claim 1 wherein the pressure in step c) is from about 0.2 to 30 millitorr.

7. A method according to claim 2 wherein aluminum is etched using a chlorine-based chemistry.

8. A method according to claim 1 wherein the conformal liner barrier Layer is etched using a fluorine-based chemistry.

9. A method of forming an aluminum line over a metal-filled via comprising the following steps:
   a) depositing a layer of aluminum about 400–1000 angstroms thick by chemical vapor deposition on a substrate including a via so as to partially fill the via,
   b) annealing the substrate by heating to a temperature of from about 350–500° C. at a pressure of from about 0.2 to 30 millitorr to fill the via with aluminum,
   c) removing the aluminum remaining on the surface of the substrate,
   d) depositing a dielectric liner-barrier layer over the substrate and the filled via,
   e) depositing an aluminum layer,
   f) etching the aluminum layer so as to form an aluminum line over the filled via; and
   g) etching the liner/barrier layer down to the substrate.

10. The method of claim 9 wherein the aluminum in step c) is removed by chemical metal polishing.

11. A method for depositing an aluminum line over an aluminuim-filled via in a dielectric substrate comprising:
   a) forming a via in said substrate,
   b) depositing an aluminum layer about 400 to 1000 angstroms in thickness over said substrate, partially filling said via with aluminum,
   c) annealing said substrate at a temperature of about 350–500° C. at a pressure of about 0.2 to 30 millitorr so as to fill said via with aluminum;
   d) depositing a liner-barrier layer over said substrate,
   e) depositing an aluminum layer over said liner-barrier layer,
   f) forming aluminum lines by anisotropic etching of said aluminum layer,
   g) anisotropically etching the liner-barrier layer using a different etch chemistry than that used for step f), and
   h) continuing to etch the underlying aluminum on the surface of the substrate with the etchant of step g).

12. A method for forming aluminum lines over aluminum-filled vias in a substrate that can compensate for some misalignment between the aluminum lines and the filled vias comprising alternately depositing liner barrier layers and aluminum layers on the substrate, and using different anisotropic etchants to etch the aluminum layers and the liner barrier layers that will not form voids in the aluminum-filled vias.

* * * * *